United States Patent [19]

Cho et al.

[11] Patent Number: 5,301,420
[45] Date of Patent: Apr. 12, 1994

[54] METHOD FOR MANUFACTURING A LIGHT WEIGHT CIRCUIT MODULE

[75] Inventors: Frederick Y. Cho, Higley; Russell J. Elias; James F. Landers, both of Tempe, all of Ariz.

[73] Assignee: Motorola, Inc., Schaumburg, Ill.

[21] Appl. No.: 86,060

[22] Filed: Jul. 6, 1993

[51] Int. Cl.⁵ ............................................. H05K 3/34
[52] U.S. Cl. ........................................ 29/840; 29/827;
   29/846; 156/654; 156/656; 156/659.1; 156/666;
   174/250; 174/261; 205/125; 205/159; 205/183
[58] Field of Search ........................ 29/827, 840, 846;
   156/654, 656, 659.1, 660; 205/125, 159, 183

[56] References Cited

U.S. PATENT DOCUMENTS 3,740,819  6/1973  Babusci et al. ......................... 29/827
3,859,177  1/1975  Gigoux ................................ 205/125

FOREIGN PATENT DOCUMENTS 1925732  2/1976  United Kingdom .

Primary Examiner—Carl J. Arbes
Attorney, Agent, or Firm—Frederick M. Fliegel

[57] ABSTRACT

A method for making a light weight circuit module includes steps of providing a substrate, drilling through holes in the substrate and plating the through holes with a metal. The substrate is a rigid planar substrate and having metallization on both sides. The method also includes steps of drilling through holes in the substrate and plating the through holes with a metal. The method also includes steps of preparing a patterned photoresist layer on at least one of the two sides, etching the metallization on the at least one side in accordance with the patterned photoresist layer, drilling support holes, filling the support holes with a material chemically distinct from the substrate, stripping the patterned photoresist layer from the at least one side and chemically removing the substrate from the metallization.

21 Claims, 1 Drawing Sheet

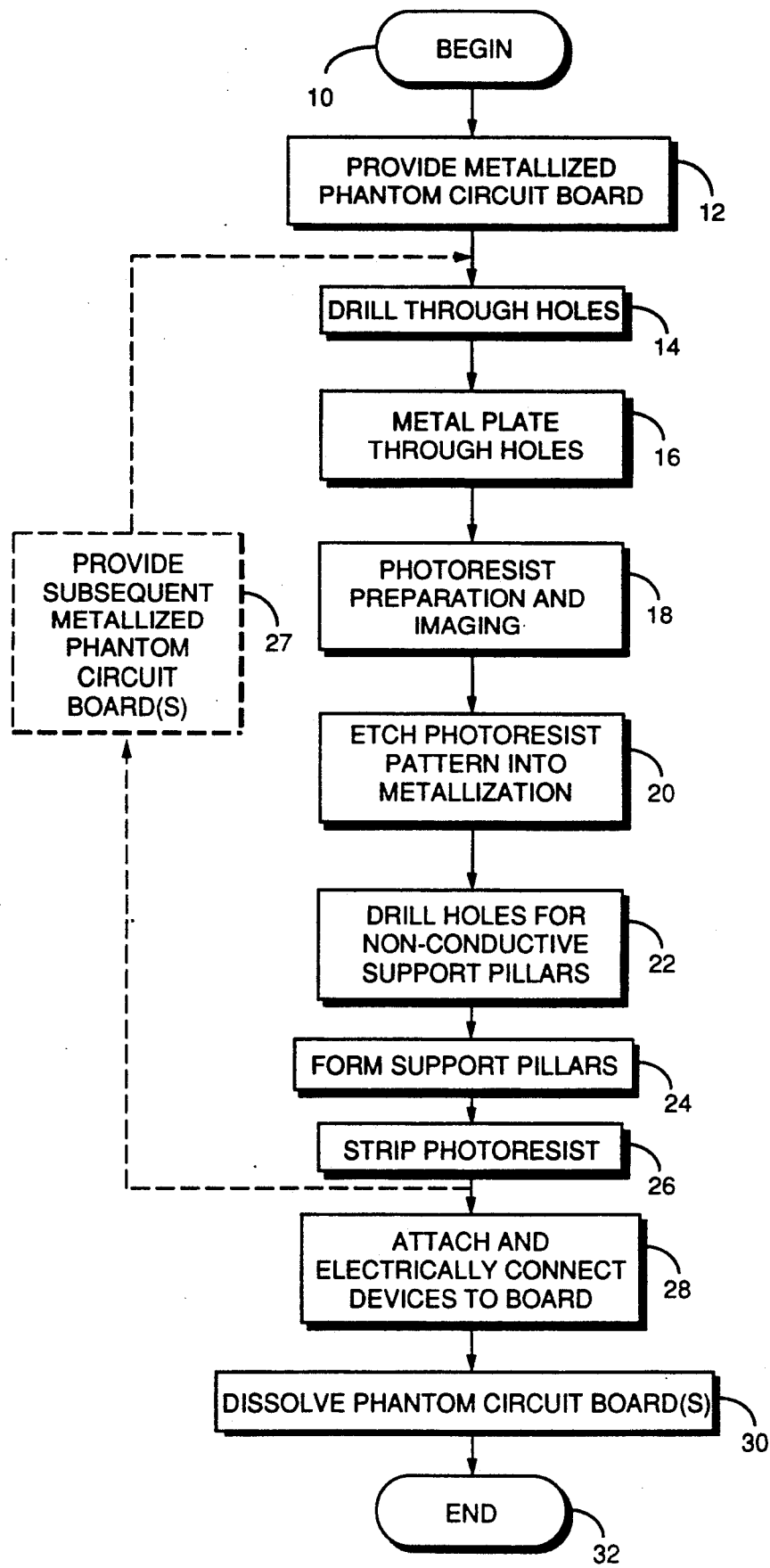

METHOD FOR MANUFACTURING A LIGHT WEIGHT CIRCUIT MODULE

FIELD OF THE INVENTION

This invention relates in general to the field of electronic modules and more particularly to lightweight electronic modules having several interconnected devices.

BACKGROUND OF THE INVENTION

Portability and ease of use are important for many new electronic products offering communications capabilities, data processing facilities and data entry and storage arrangements. Providing these and other features in a user-friendly and convenient package requires additional sophistication in circuit design and places a premium on performance as compared to weight of the product.

Conventional printed circuit cards provide a rugged and robust vehicle for realizing electronic circuitry of almost arbitrary complexity and sophistication. However, printed circuit cards invest substantial mass in the card itself, typically a fiberglass and epoxy matrix. It has been especially uneconomical and impractical to provide lightweight printed wiring boards wherein the ratio of the mass of the active circuitry to the mass of the product approached unity.

This problem is exacerbated in products having functional requirements sufficiently different as to preclude forming the product from a single monolithic circuit. For example, a handheld telephone requires digital circuitry for accomplishing dialing, memory functions such as speed dialing and cryptographic or other techniques for foiling unauthorized use. Also required are radio frequency circuits, operating in the neighborhood of a GigaHertz, which are not amenable to monolithic cointegration with power-efficient digital circuits using present-day integrated circuit fabrication capabilities. In such products, it is extremely desirable to reduce the weight of elements incorporated to interconnect distinct functional blocks having immiscible design requirements.

What is needed is a method for reducing the mass of the interconnections required between circuitries having functional differences presently precluding their cointegration in monolithic form.

SUMMARY OF THE INVENTION

The present invention provides a method for making a light weight circuit module. The method includes providing a rigid planar substrate having metallization disposed on at least a first and a second planar surface thereof. The first and second planar surfaces are substantially parallel to one another. The method further includes providing airbridge conductors on a surface of the substrate and chemically removing the substrate from the metallization to leave the airbridge conductors supported by airbridges and intervening support pillars.

The present invention provides a method for making a light weight circuit module. The method includes providing a rigid planar substrate having metallization disposed on at least a first and a second planar surface of the substrate. The first and second planar surfaces are substantially parallel to one another. The method also includes drilling through holes through the substrate, plating the through holes with a metal and preparing a patterned photoresist layer on at least one of the first and second surfaces. The method further includes etching the metallization on the at least one of the first and second surfaces in accordance with the patterned photoresist layer, drilling support holes, filling the support holes with a material chemically distinct from the substrate, stripping the patterned photoresist layer from the at least one of the first and second surfaces and chemically removing the substrate from the metallization.

BRIEF DESCRIPTION OF THE DRAWING

The invention is pointed out with particularity in the appended claims. However, a more complete understanding of the present invention may be derived by referring to the detailed description and claims when considered in connection with the sole figure, illustrating a flow diagram of a process for manufacturing a light-weight circuit module in accordance with the present invention. The exemplification set out herein illustrates a preferred embodiment of the invention in one form thereof, and such exemplification is not intended to be construed as limiting in any manner.

DETAILED DESCRIPTION OF THE DRAWING

The sole FIGURE illustrates a flow diagram of a process for manufacturing a light-weight circuit module in accordance with the present invention. The process begins (block 10) by providing (block 12) a suitable metallized phantom circuit card.

In a preferred embodiment, a substrate comprising a phantom polystyrene circuit card, desirably in the range of from 0.020" to 0.031" (but which may be thicker or thinner as desired) thick is laminated on both sides with electrodeposited copper foil 0.5 oz. to 3 oz. thick (such foils are typically categorized by the weight of the foil per square foot). Foils of this type are usefully fashioned by electrodepositing metal onto a drum to form a metal layer, which is subsequently stripped from the drum to provide the foil.

In a preferred embodiment, the metallization has tooth-like structures on the side of the foil contacting the polystyrene material where the individual teeth are between 0.002" and 0.0002" high and are spaced at intervals of circa 0.001" or more. Such copper foil is available as Type ED foil, manufactured and distributed by Gould, Inc. The lamination may usefully be performed with either a hydraulic or an autoclave press process.

Typically, in a hydraulic process, the temperature rise rate versus time is approximately 5° C./minute, stabilizes at a temperature of about 120° C. and is maintained at this temperature for a period of about ten minutes with an attendant pressure of approximately 50 pounds per square inch. The temperature is usefully decreased at a rate of 8° C./minute until room temperature is reached.

Suitable polystyrene materials of this type are available as extruded sheet stock from Cadillac Plastics and/or Piper Plastics, both of Phoenix, Ariz. Raw plastic materials are available from a variety of manufacturers including Type Polysar 205 and 220, available from Polysar; Types R1, R2 or R3, available from Amoco Chemicals; Type Dilene 8, 8E or 8G, available from Arco; and Types Fina 740, 825E or 945, available from Fina, for example. Other materials which may be usefully employed for substrata include Acrylonitrile Butadiene Styrene or ABS, polycarbonate, cellulose acetate, propionate, butyrate, etc. and acrylic plastics (e.g., polymethyl methacrylate). The criteria for selecting a plastic for use as a phantom circuit card is that the plastic (or other) material must have solvent (or reactive) sensitivity such that it may be selectively removed following conductor formation (described infra) without harm to the conductors or other components.

When through holes or vias are desired in the finished light-weight circuit module, through holes are drilled (block 14) through the metallization and the phantom circuit card, using conventional rotary drilling techniques, laser drilling techniques or any other process providing holes having the required wall smoothness characteristics and diameters. The through holes are then plated (block 16) to coat the interior of the hole with a conductive material, such as, by way of example, copper. Copper is usefully deposited into holes by an electroless plating process, for example. Electroless plating solutions such as Type Circuposit, available from Shipley, are suitable for plating through holes. Immersion of the phantom card in the solution for a period of one-half hour, for example, is generally sufficient to provide 0.00006" thick copper films.

Typically, a thicker film is desired and this is usefully accomplished by electroplating further metal over the copper deposited by electroless plating. This second coat of metal is usefully plated to a thickness of between 0.025 to 0.1 mm using a Type 1100 solution available from Shipley in accordance with manufacturer's directions.

Photoresist is then applied and an image is created in the resist (block 18) by standard photolithographic processes well known in the art. An example of a negative resist suitable for this application is Type DuPont 3600 (Riston), available from E. I. DuPont Nemours. The photoresist image is then etched into the metallization on at least one side of the phantom circuit card. The etching is usefully accomplished using a solution of cupric chloride in water having an appropriate strength at a temperature of 30° C. and providing an etch rate of approximately one ounce per minute, for example. Other solutions suitable for use with copper metallizations include ammoniacal chloride solutions, ferric chloride, etc.

When support pillars are required, additional holes are drilled in appropriate locations as required (block 22). For example, 0.020" holes may be placed every 0.1" along the length of a conductor trace. The holes for the nonconductive support pillars or posts are then filled (block 24) with a suitable material which is then cured or hardened. For example, an epoxy material such as Type Ablebond 293-1, available from Ablestick Labs of Rancho Domingo, Calif. or Hysol EA-956 as supplied by Dexter-Hysol may be applied by screen printing techniques or via syringe and cured with suitable heat treatment. Materials useful for forming support pillars are not dissolved by (or reactive with) the solvents used to remove the phantom U circuit card and desirably are not solvent sensitive (i.e., do not absorb the solvents or swell significantly on exposure thereto). Epoxies and especially epoxies including filler materials to mitigate solvent sensitivity are usefully employed to provide such pillars, however, other materials may be used. Drilling (block 22) and filling (block 24) holes to form support pillars may be done at any point after providing the phantom circuit card (block 12), provided that the material chosen for filling (block 24) and the treatment or curing process therefor are chemically and temperature compatible with steps following these operations.

The photoresist employed initially for patterning of the metallization may be removed at any step following the etching step (block 20) but is usefully removed or stripped (block 26) following drilling (block 22) holes for support pillars. This provides the advantage of protecting the metallization from scratching, etc. during drilling (block 22).

Attachment of devices (block 28) is then desirably performed. Devices to be attached may include integrated circuits, filters such as surface acoustic wave devices and other microelectronic components. These are usefully attached by gluing them down with epoxy, for example, or by flip-chip and solder-bump techniques as are known in the art. When die attach techniques such as gluing, backside soldering, etc., are employed, need for electrical interconnections may be met by wirebonding, for example. Wirebonds are metallurgically attached to bonding pads or interconnection sites on the microelectronic device(s) and interconnection pads formed in the metallization during the etching step, with a wire extending between the sites and the pads.

This portion of the light-weight circuit module fabrication process desirably ends (block 32) following dissolution (block 30) of the phantom circuit board. Attachment (block 28) of some or all devices may occur board dissolution (block 30). Attachment (block 28) of devices may precede board dissolution provided the devices are chemically compatible with the dissolution process.

When polystyrene board material is employed, dissolution (block 30) is usefully carried out by soaking the board in a 50:50 mixture of methylene chloride and acetone at room temperature for about five minutes and then spraying or streaming fresh mixture through a small orifice at a pressure of twenty to thirty pounds per square inch. This may be done above or below the surface of a liquid bath of the solvent mixture. A #26 syringe needle coupled to a standard syringe was successfully employed as a test vehicle for the spraying process. The spraying process removed the polystyrene material without requiring further cleaning or additional solvent treatments.

In an alternative embodiment, further layers of conductors may be added. In this embodiment, a subsequent metallized phantom circuit board is added (block 27) following stripping of the photoresist (block 26), as indicated by dashed lines in the sole FIGURE. The subsequent board desirably includes metallization on only one (top) surface thereof. Steps of drilling (block 14, through plating (block 16), photoresist preparation and imaging (block 18), etching (block 20), drilling holes (block 22) and forming supports therein (block 24) and stripping photoresist (block 26) are carried out in order to form a subsequent metallization layer. These steps (blocks 27, 14–26) may be repeated to provide the number of layers required.

Thus, a process for manufacturing a light weight circuit module has been described which overcomes specific problems and accomplishes certain advantages relative to prior art methods and mechanisms. The improvements over known technology are significant. The weight of the circuit card itself is obviated by dissolution of the phantom board used to hold the metallization in place during intermediate processing is avoided. Capacitance between conductors and from conductors to a ground or common conductor is reduced because the relative dielectric constant of the intervening material is reduced.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

I claim:

1. A method for making a light weight circuit module, said method comprising steps of:
   providing a substrate, the substrate comprising a rigid planar substrate and having metallization disposed on at least a first and a second planar surface thereof, wherein the first and second planar surfaces are substantially parallel to one another;
   drilling through holes in the substrate;
   plating the through holes with a metal;
   preparing a patterned photoresist layer on at least one of the first and second surfaces;
   etching the metallization on the at least one of the first and second surfaces in accordance with the patterned photoresist layer;
   drilling support holes;
   filling the support holes with a material chemically distinct from the substrate;
   stripping the patterned photoresist layer from the at least one of the first and second surfaces; and
   chemically removing the substrate from the metallization.

2. A method as claimed in claim 1, further comprising steps of:
   die bonding electronic devices to metallized islands formed during said etching step; and
   electrically interconnecting interconnection sites on the electronic device to interconnection pads formed during said etching step.

3. A method as claimed in claim 2, wherein said electrically interconnecting step comprises a step of wirebonding the interconnection sites to the interconnection pads.

4. A method as claimed in claim 1, wherein said step of providing a substrate comprises a step of providing a polystyrene substrate having electrodeposited copper foil having a uniform thickness of between 0.001 inch and 0.005 inch disposed on both the first and second planar surfaces.

5. A method as claimed in claim 4, wherein said step of chemically removing the substrate includes a step of dissolving a polystyrene substrate in a solution comprising at least one of the group consisting of methylene chloride and acetone.

6. A method as claimed in claim 1, wherein said filling step includes a step of filling the support holes with epoxy.

7. A method as claimed in claim 1, wherein said step of plating the through holes includes a step of plating the through holes with a metal using an electroless plating solution.

8. A method as claimed in claim 1, wherein said etching step includes a step of etching the metal in a solution of cupric chloride.

9. A method as claimed in claim 2, wherein said step of electrically interconnecting comprises a step of wirebonding between interconnection sites on the electronic device and interconnection pads formed during said etching step.

10. A method for making a light weight circuit module, said method comprising steps of:
    providing a substrate, the substrate comprising a rigid planar substrate and having metallization disposed on at least a first and a second planar surface thereof, wherein the first and second planar surfaces are substantially parallel to one another;
    providing airbridge conductors on the first surface of the substrate; and
    chemically removing the substrate from the metallization to leave the airbridge conductors supported by airbridges and intervening support pillars.

11. A method as claimed in claim 10, wherein, prior to said preparing step, there are included steps of:
    drilling through holes in the substrate; and
    plating the through holes with a metal.

12. A method as claimed in claim 10, wherein said step of providing airbridge conductors includes steps of:
    preparing a patterned photoresist layer on at least one of the first and second surfaces;
    etching the metallization on the at least one of the first and second surfaces in accordance with the patterned photoresist layer;
    drilling support holes;
    filling the support holes with a material chemically distinct from the substrate to provide support pillars; and
    stripping the patterned photoresist layer from the at least one of the first and second surfaces.

13. A method as claimed in claim 12, wherein said filling step includes steps of:
    filling the support holes with epoxy; and
    curing the epoxy to provide rigid epoxy support pillars.

14. A method as claimed in claim 10, further including steps of:
    die bonding electronic devices to metallized islands formed during said etching step; and
    electrically interconnecting interconnection sites on the electronic device to interconnection pads formed during said etching step.

15. A method as claimed in claim 10, wherein said step of chemically removing the substrate includes a step of dissolving a polystyrene substrate in a solution comprising at least one of the group consisting of methylene chloride and acetone.

16. A method as claimed in claim 10, wherein said step of providing a substrate comprises a step of providing a polystyrene substrate having electrodeposited copper foil having a uniform thickness of between 0.001 inch and 0.005 inch disposed on both the first and second planar surfaces.

17. A method as claimed in claim 12, wherein said etching step includes a step of etching the metal in a solution of cupric chloride.

18. A method as claimed in claim 11, wherein said step of plating the through holes includes a step of plating the through holes with a metal using an electroless plating solution.

19. A method as claimed in claim 10, wherein said step of providing a substrate includes a step of providing a polystyrene substrate.

20. A method as claimed in claim 19, wherein said step of chemically removing the substrate includes steps of:
- soaking the substrate in a solution comprising at least one of the group consisting of methylene chloride and acetone for a first period of time; and
- spraying the substrate with a solution comprising at least one of the group consisting of methylene chloride and acetone.

21. A method as claimed in claim 12, wherein the at least one of the first and second surfaces is the first surface, further comprising, following said stripping step, steps of:
- providing another substrate, the another substrate comprising a rigid planar substrate and having another metallization disposed on a first planar surface thereof, wherein the first planar surface is substantially parallel to a second plane surface thereof, the second surface of the another substrate being bonded to the first surface of the substrate;
- preparing another patterned photoresist layer on the first surface of the another substrate;
- etching the another metallization on the first surface of the another substrate in accordance with the another patterned photoresist layer;
- drilling support holes;
- filling the support holes with a metal chemically distinct from the substrate and the another substrate to provide support pillars;
- stripping the another patterned photoresist layer from the first surface of the another substrate; and
- chemically removing the substrate and the another substrate from the metallization to leave airbridge conductors supported by airbridge and intervening support pillars.

* * * * *

UNITED STATES PATENT AND TRADEMARK OFFICE
CERTIFICATE OF CORRECTION

PATENT NO. : 5,301,420
DATED      : APRIL, 12, 1994
INVENTOR(S): Frederick Y. Cho et al.

It is certified that error appears in the above-indentified patent and that said Letters Patent is hereby corrected as shown below:

Column 8, claim 21, line 11, change "metal" to --material--.
Column 8, claim 21, line 18, change "airbridge" to --airbridges--.

Signed and Sealed this

Twenty-second Day of November, 1994

Attest:

BRUCE LEHMAN

*Attesting Officer*          *Commissioner of Patents and Trademarks*